United States Patent
Bourianoff et al.

(10) Patent No.: US 7,212,026 B2
(45) Date of Patent: May 1, 2007

(54) SPIN-ORBITAL QUANTUM CELLULAR AUTOMATA LOGIC DEVICES AND SYSTEMS

(75) Inventors: George I. Bourianoff, Austin, TX (US); Dmitri E. Nikonov, Morgan Hill, CA (US); Jun-Fei Zheng, Westport, CT (US)

(73) Assignee: Intel Corporation, Santa Clara, CA (US)

( * ) Notice: Subject to any disclaimer, the term of this patent is extended or adjusted under 35 U.S.C. 154(b) by 14 days.

(21) Appl. No.: 10/978,115

(22) Filed: Oct. 29, 2004

(65) Prior Publication Data

US 2006/0091914 A1 May 4, 2006

(51) Int. Cl.
*H03K 19/195* (2006.01)

(52) U.S. Cl. ............. 326/7; 326/1; 326/6; 326/104

(58) Field of Classification Search ........ 326/1–2, 326/7, 104, 136; 257/14–17, 22–25
See application file for complete search history.

(56) References Cited

U.S. PATENT DOCUMENTS

| | | | | |
|---|---|---|---|---|
| 6,333,516 B1 * | 12/2001 | Katoh et al. | | 257/22 |
| 6,774,391 B1 * | 8/2004 | Cowburn | | 257/24 |
| 6,924,501 B2 * | 8/2005 | Komori | | 257/14 |

OTHER PUBLICATIONS

Bandyopadhyay, S., et al., "Granular nanoelectronics The logical gateway to the 21st century", IEEE Potentials, Apr./May 1996, pp. 8-11.

Lent, Craig S., et al., "A Device Architecture for Computing with Quantum Dots", Proceedings of the IEEE, Apr. 1997, pp. 541-557, vol. 85, No. 4

Dandyopadhyay, S., "Self-assembled nanoelectronic quantum computer based on the Rashba effect in quantum dots", The American Physical Society, May 15, 2000, pp. 813-820, vol. 61, No. 20.

Tokura, Yoshinori, "Frontier 2 Correlated Electrons: Science to Technology", JSAP International, Jul. 2000, pp. 12-21, No. 2.

(Continued)

*Primary Examiner*—Anh Q. Tran
(74) *Attorney, Agent, or Firm*—Blakely, Sokoloff, Taylor & Zafman LLP (57) ABSTRACT

Spin-orbital quantum cellular automata logic devices and integrated circuits in the form of a substrate having a thin film of material on the substrate having strongly coupled spin-orbital states, the thin film being patterned to define at least one input and at least one output, and to perform at least one logic operation by associated arrangement of the spin-orbital states between the input and the output. The logic devices and integrated circuits further include an input device at each input to define the spin-orbital states at each input, and an output sensor at each output for sensing the spin-orbital states of the thin film at the output. In an integrated circuit, the output of one gate or circuit, in the form of the ferromagnetically aligned spins, can be directly coupled to the next gate or circuit, so that entire circuits can be fabricated and effectively interconnected, only requiring interfacing for overall. circuit input and output using the electromagnetic inputs and magnetic measurements for the outputs.

25 Claims, 6 Drawing Sheets

OTHER PUBLICATIONS

Saitoh, E., et al., "Observation of orbital waves as elementary excitations in a solid", Letters to Nature, Mar. 8, 2001, pp. 180-183, vol. 410.

Cowburn, R.P., "Magnetic nanodots for device applications", Journal of Magnetism and Magnetic Materials, 2002, pp. 505-522, no month.

Kelly, Daniel P., "Logic Devices for Partitioned Quantum-Dot Cells", IEEE-NANO, Oct. 28-30, 2001.

Xiong, Gang, et al., "Magnetic nanoelements for magnetoelectronics made by focused-ion-beam milling", Applied Physics Letters, Nov. 19, 2001, vol. 79, No. 21.

Vetteth, Anoop, et al., "Quantum-Dot Cellular Automata Carry-Look-Ahead Adder and Barrel Shifter" IEEE Emerging Telecommunications Technologies Conference at Dallas, Texas, Sep. 2002.

Csaba, Gyorgy, et al., "Nanocomputing by Field-Coupled Nanomagnets", IEEE Transactions on Nanotechnology, Dec. 2002, vol. 1, No. 4.

Tokura, Yoshinori, "Correlated-Electron Physics in Transition-Metal Oxides", Physics Today, Jul. 2003, pp. 50-55.

David J. K. Goldhaber-Gordon, "Quantum-Dot Cells and Wireless Electronic Logic, Summary Based Upon a May 1995 Lecture at MIT by Prof. Craig Lent of the University of Notre Dame", 1995, MITRE Nanosystems Group and Physics Department, Massachusetts Institute of Technology.

Stephen Blundell, "Magnetism in Condensed Matter", 2001, Chapter 4, pp. 74-83, Oxford University Press, Oxford, United Kingdom, no month.

* cited by examiner

| A | A | A | Out |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

SPIN-ORBITAL QUANTUM CELLULAR AUTOMATA LOGIC DEVICES AND SYSTEMS

BACKGROUND OF THE INVENTION

1. Field of the Invention

The embodiments of the present invention relate to the field of nanocomputing.

2. Prior Art

Embodiments of the present invention are intended to produce logic devices that are smaller, faster, less expensive, and more power efficient than anticipated 16 nm CMOS devices. Presently such goals are pursued by dimensional scaling (reducing gate length, operating voltage) and have improved transistor performance for multiple generations. However, as critical device dimensions approach atomic length scales, it will not be possible to reduce critical dimensions further, and alternative means of storing and manipulating information must be found.

Conventional computing devices including CMOS devices associate computational state (information) with electronic charge and then manipulate, store and detect those charges to perform logic operations. However, computational state can be associated with other physically conserved quantities including spin. Many concepts have been published which involve using the spins of single electrons in quantum dots (see "Granular nanoelectronics", Bandyopadhyay et al., *IEEE Potentials*, April/May 1996, Pgs. 8–11 and "Self-assembled nanoelectronic quantum computer based on the Rashba effect in quantum dots", Bandyopadhyay, *Physical Review B*, The American Physical Society, Vol. 61, No. 20, May 15, 2000, Pgs. 813–820) to encode information. The disadvantages of this computing paradigm include a basic trade off between the tight coupling between spins and the resulting higher decoherence rate as well as a lack of logic architecture which would ensure input isolation.

Several different implementations of QCA systems have been proposed that utilize different physical invariants to store information and different interaction mechanisms One such implementation uses electric dipoles stored in quantum dots to store information and the electrostatic force field to effect the interaction (see "A Device Architecture for Computing with Quantum Dots", Lent et al., *Proceedings of the IEEE*, Vol. 85, No. 4, April 1997, Pgs. 541–557). This approach suffers from several problems including sensitivity to stray charge, system hang up in metastable states, asynchronous operation and others.

Another implementation uses magnetic dipoles to store information and the magnetic coupling between adjacent dipoles to enable cell interaction. The sequential flipping of magnetic configurations in a QCA architecture can be used to perform logic operations and several simple logic gates have been described in the literature (see "Nanocomputing by field coupled nanomagnets", Casba et al., *IEEE Transactions of Nanotechnology*, Vol. 1, No. 4, 2002). These implementations involve discrete magnetic domains and discrete electric dipole moments.

DETAILED DESCRIPTION OF THE PREFERRED EMBODIMENTS

Embodiments of the present invention may be differentiated from prior art in that it enables continuous scaling of the size of the unit cells intrinsic to QCA down to the atomic sizes and the physical attributes that stores the information (coupled ferromagnetic and transport phase states).

Figure 1:
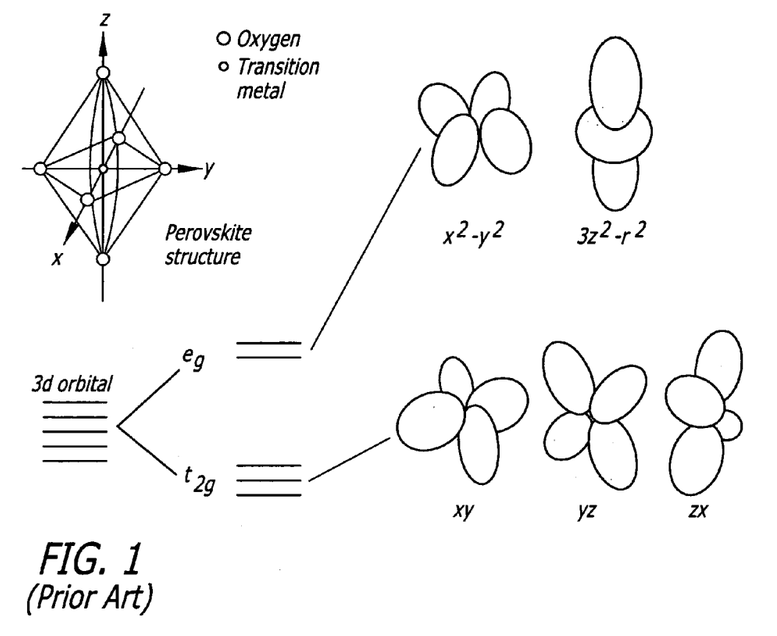
FIG. 1 is a diagram showing the energy band structure in certain manganite crystals, where the energy levels are associated with different orbital states of the 3d shell electrons.
Figure 2:
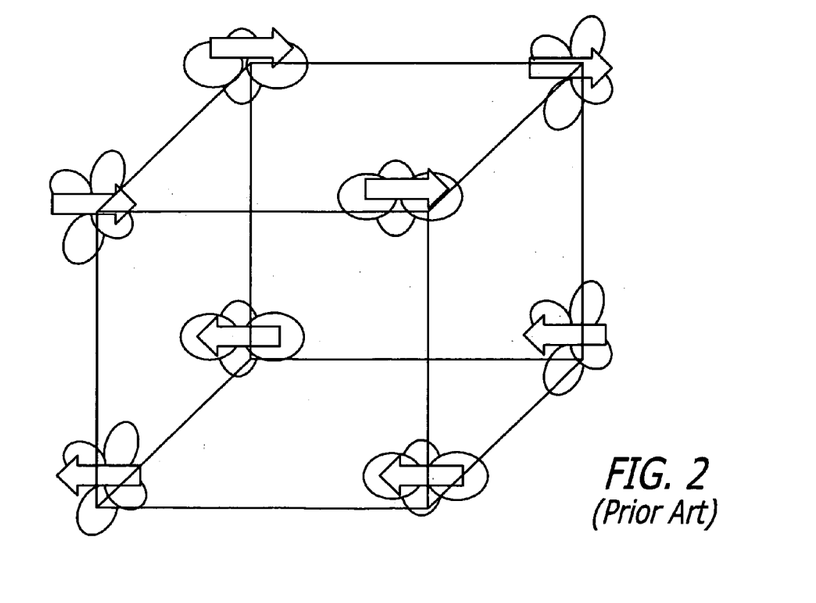
FIG. 2 illustrates the correlation between orbital symmetry and atomic spin, as denoted by the arrows, for manganite crystals.

The embodiments use a novel implementation of the quantum cellular automata (QCA) architecture QCA systems that use unit cells physically configured so they spontaneously interact with each other in a sequential fashion to perform logic operations. In particular, certain crystalline materials, such as transition metal oxides, exhibit strongly correlated electronic, structural and magnetic effects. The manganese atoms in certain manganite crystals have an energy band structure as shown in FIG. 1, where the energy levels are associated with different orbital states of the 3d shell electrons. In the Figure, the electron wavefunction amplitudes are illustrated by the smooth shaded objects associated with each energy level. FIG. 2 illustrates the correlation between orbital symmetry and atomic spin as denoted by the arrows. The arrangement of spins shown in FIG. 2 corresponds to ferromagnetic orientation (all arrows pointing in the same direction) in the xy-plane and anti-ferromagnetic orientation (arrows pointing in alternating directions) along the z-axis. The energy splitting of the $e_g$ shell electrons make it possible to change the local orbital symmetry and hence the spins by applying a bias voltage or magnetic field across the atom.

Figure 3:
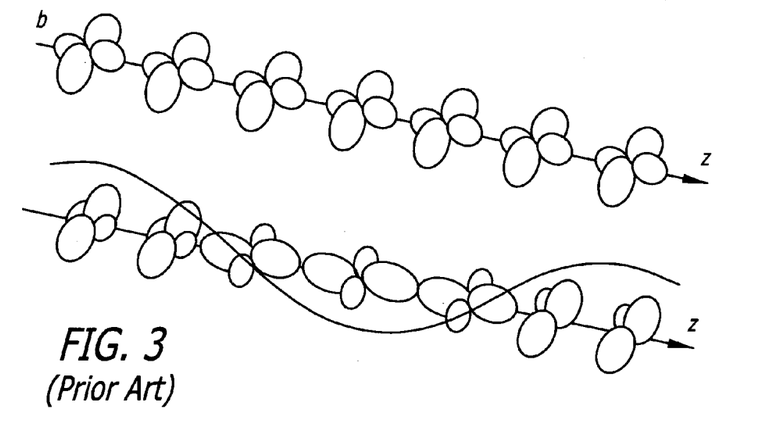
FIG. 3 illustrates the coherent orbital wave generated by the sequential flipping of spin-orbital configurations caused by a change in the spin-orbital configuration of one unit cell inducing a deterministic change in the spin orbital configuration of an adjacent unit cell.

The spin-orbital states of manganese atoms in adjacent unit cells are strongly coupled together by an exchange interaction. Sometimes, there is an indirect 3 way wavefunction overlap mediated by oxygen atom electrons (called "superexchange"). Other times there is hopping of an electron from a manganese ion to the oxygen ion accompanied by hopping of another electron from an oxygen ion (called "double exchange"). In either case, the net result is that a change in the spin-orbital configuration of one unit cell will induce a deterministic change in the spin orbital configuration of an adjacent unit cell. This sequential flipping of spin-orbital configurations generates a coherent orbital wave that has been experimentally observed (see "Observation of orbital waves as elemental excitations in a solid", Saltoh et al., Nature, Vol. 410, Mar. 8, 2001) and is illustrated in FIG. 3.

Figure 4:
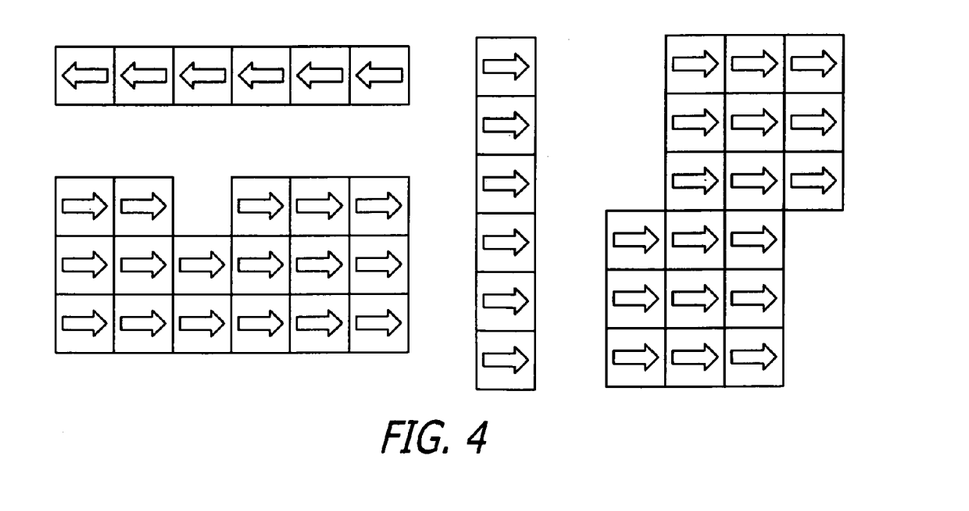
FIG. 4 illustrates the possibility of single or a few cell wide wires with ferromagnetically aligned spins.

In accordance with the preferred embodiments, integrated circuits are formed by depositing and patterning a thin film of a manganese oxide (e.g. of $La_xSr_{1-x}MnO_3$) with one or a few layers of the lattice cells on a substrate (e.g. $SrTiO_3$ or Si with a buffer layer of $SrTiO_3$). By engineering the transition layer between the substrate and the transition metal oxide film, one can ensure that the film is such that the plane of ferromagnetic alignment coincides with the plane of the substrate (the chip). FIG. 4 illustrates the possibility of patterning the deposited film to form single or a few cell wide wires with ferromagnetically aligned spins. The state of the input spin at the beginning of the wire is transferred to its end. The wires can be one or a few lattice cells wide. From the drawings, it may be seen that the wires are robust to fluctuations of width or positioning of the wires due to process variations. One of the ways to fabricate lines of a few lattice cells wide is to lithographically pre-pattern a line with coarser-resolution lithography and ensure that the transition metal oxide is formed preferentially in the middle of the pre-patterned line. This avoids issues related to growth of films with discontinuities due to stress or defects on the substrate surface. It also avoids problems of magnetic domain formation if the width of the wire is above a critical value. The unit cells can be arranged or patterned to perform a myriad of logic operations. Another possible way to fabricate a line is to mask the area with a thin film (e.g. 10 Å amorphous $TiO_2$) leaving only the area for the line unmasked. In this way, only the unmasked area will have the desired crystalline quality of the transitional metal oxide formed while the area masked by thin film is of the amorphous transition metal oxide. The second method will allow (1) easy and controllable fabrication using routinely practiced technology and (2) a flatter structural layer for easy vertical integration.

Figure 5:
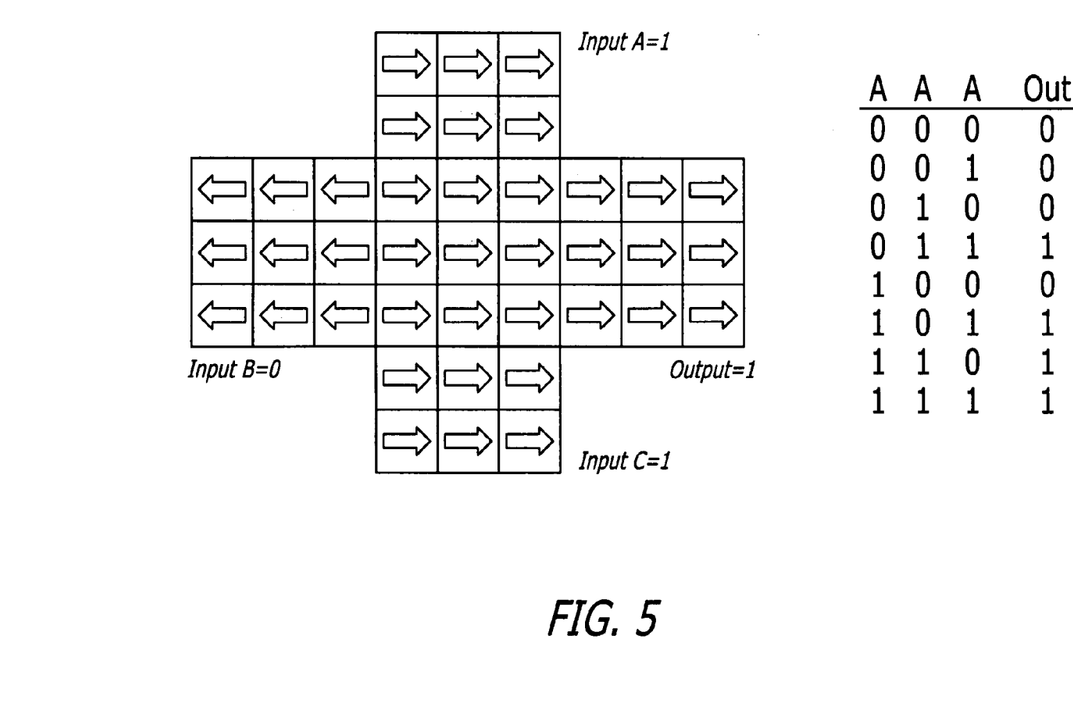
FIG. 5 illustrates a possible structure of a majority gate implemented on the crystal lattice scale.

For instance, one of the novel elements of the preferred embodiments is the structure of the majority gate implemented on the crystal lattice scale, as shown in FIG. 5. It comprises two crossing wires that can be of a single or a few lattice cells wide. The simulations subsequently discussed validate that the gate operates as desired for a wide set of geometric parameters. The input to a logic element to set the spin orbital states may be by way of a controlled magnetic field, and the output may be by a magnetic sensor sensing the giant magnetoresistance effect (used in hard drives and magnetic RAMs) at the output. Coupling between gates and other circuits may be in the form of the direct coupling of the ferromagnetically aligned spins as in the gates or circuits themselves.

Figure 6:
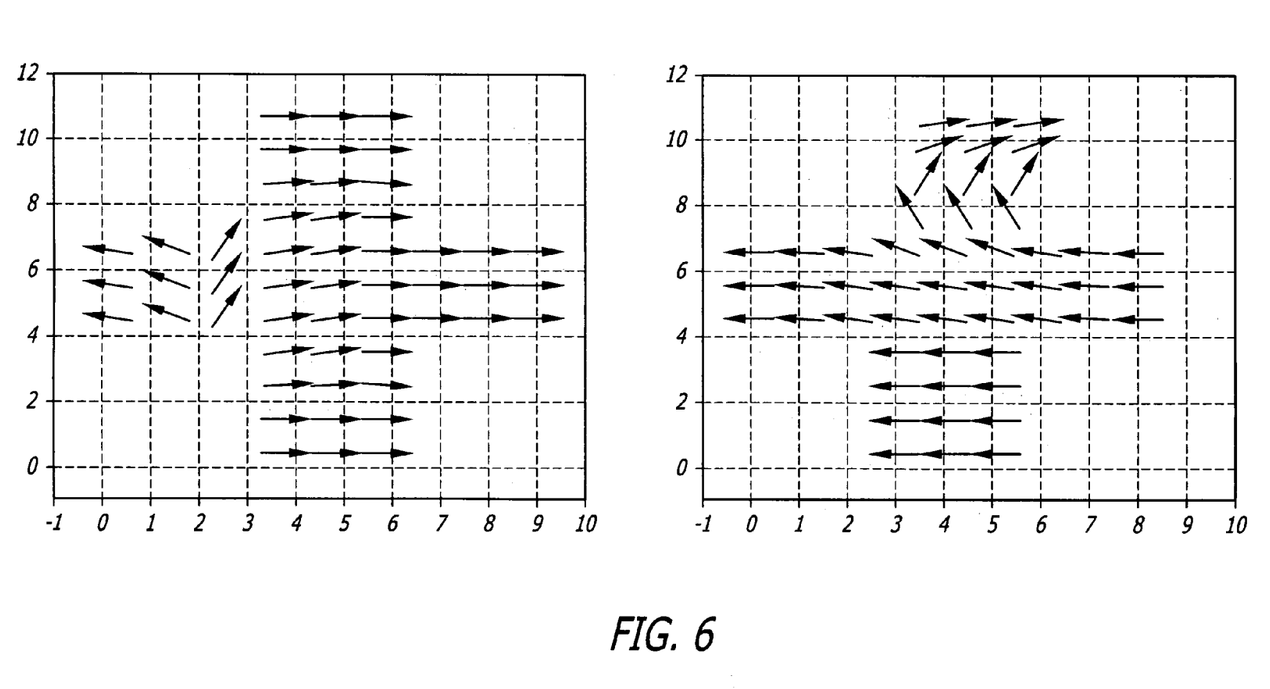
FIG. 6 shows the steady states of the majority gate for the two non-trivial combinations of inputs.

The majority gate is a principal logic element. It uses 3 inputs and one output. It embodies the functionality of traditional OR and AND gates, depending on the third input. The output is determined by the most prevalent logical value among the inputs. With the third input set to represent a zero, the output will represent the logical output of a two input AND gate. With the third input set to represent a one, the output will represent the logical output of a two input OR gate. FIG. 6 shows the steady states of the majority gate for the two non-trivial combinations of inputs:

a) top and bottom spins to the right (1 and 1), left spin to the left (0);

b) bottom and left spins to the left (0 and 0), top spin to the right (1).

One can see that the minority value is isolated in its own ferromagnetic domain.

The output is, in fact, well defined and is equal to the desired value as per FIG. 5.

Figure 7:
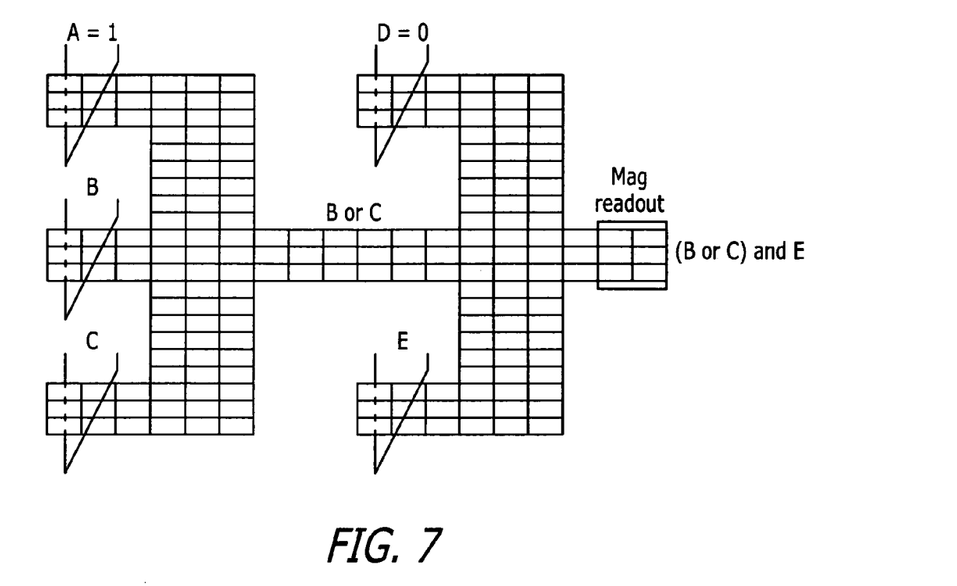
FIG. 7 presents an example of a simple integrated circuit using an embodiment of the present invention.

An example of a simple integrated circuit using an embodiment of the present invention may be seen in FIG. 7. In this embodiment, two majority gates are directly coupled by the ferromagnetically aligned spins, the first gate having a predetermined input to act as an OR gate, and the second gate having a predetermined input to act as an AND gate. Initialization is done with a current in an integrated microcoil formed by wires above and below a transition metal oxide film above and below the unit cells. In this embodiment, the two states of the input (ferromagnetic or antiferromagnetic) may be driven by a positive or negative currents through the micro coil of appropriate magnitude. The read-off is done using the giant magnetoresistance effect through contacts above and below the plane of the unit cells in the output region. The read heads contain a permanently magnetized ferromagnetic film. If the direction of the spin in the output cell of the logic circuit is parallel to the magnetization of the ferromagnetic contacts, the vertical current through the stack is much larger than in the case of anti-parallel orientation. The layer of unit cells may be a single atomic layer of one unit cell, or one may be able to use several atomic layers of unit cells, in order to increase the net spin effect desired. This is referred to in the claims as an electromagnetic input device and an magnetic output sensor.

Embodiments of the invention may attain computational throughput (defined as operations per second per square centimeter per Watt) superior to end of the roadmap scaled CMOS devices. Potential device parameters could be as small as 10 fs operation time, 6A critical dimension and $10^{-21}$ Joules switching energy. Embodiments of the present invention can potentially achieve these operational parameters because there is no electron flow associated with the information processing. All interactions are accomplished by quantum mechanical interactions such as exchange and double exchange interactions.

Figure 8:
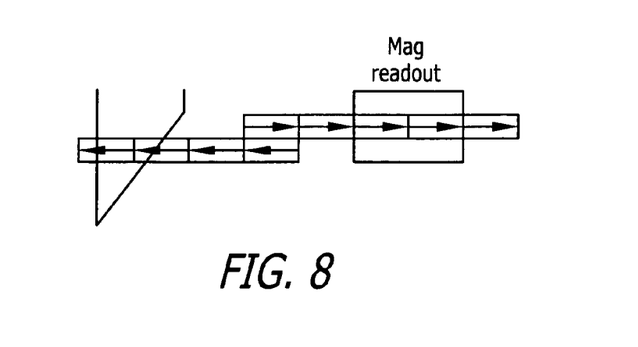
FIG. 8 presents the unit cell layout for an inverter, which uses the anti-magnetic striping characteristic of the applicable material.

FIG. 8 presents the unit cell layout for an inverter, which uses the anti-magnetic striping characteristic of the applicable material. To fabricate the inverter, first lithographically pre-pattern, and then deposit a monolayer of material, such as $LaVO_{3-}$, in the pattern shown. The inversion takes place as a natural consequence of the offset of one part of the wire relative to the rest of the wire by one unit cell. The shift must be in the direction of the anti-ferromagnetic ordering, i.e., the one that tends to align the spins of the adjacent rows in the opposite directions. The input device and the output sensor are illustrated to each be of one of the types later described herein.

Given AND gates, OR gates and inverters, one can assemble many other gates such as XOR gates, gates with a greater number of inputs and other logic circuits such as half adders, full adders, etc., as is well known in the electronic circuits art. Because the output of one gate or circuit, in the form of the ferromagnetically aligned spins, can be directly coupled to the next gate or circuit, entire circuits can be fabricated and effectively interconnected, only requiring interfacing for overall circuit input and output using the electromagnetic or electrostatic inputs and resistance or magnetic measurements for the outputs.

In order to validate the practical aspects of embodiments of the invention, simulation of the dynamics of the spin-orbital dynamics of the electrons localized on the crystal sites was confirmed. The solution of the quantum density matrix equations, taking facts from practical operations, includes the interaction with the external initializing magnetic field, exchange interaction between electrons on the nearest neighbor sites, and spin relaxation due to uncontrollable changes of the environment (distant magnetic moments and crystal deformations).

Figure 9:
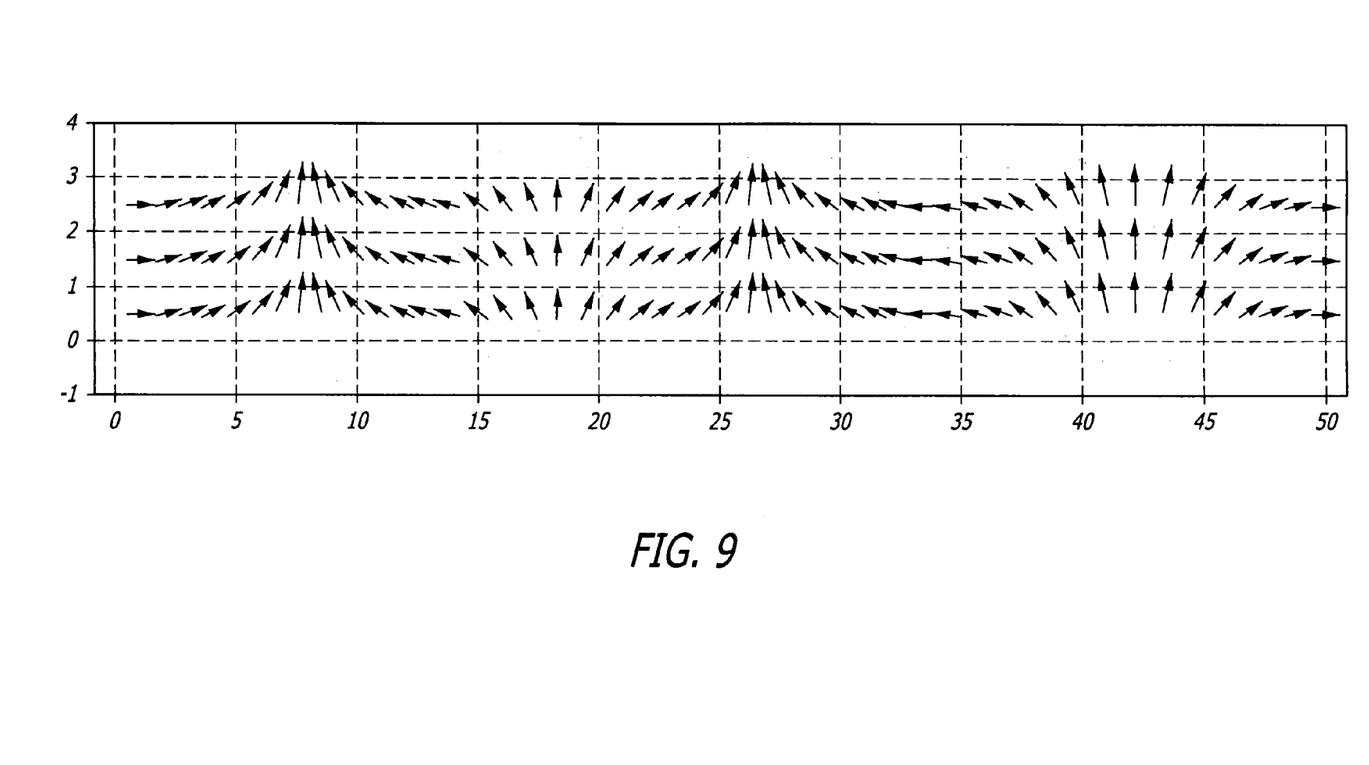
FIG. 9 illustrates the propagation of the spin-orbital wave along the wire of 3 lattice cell width.

FIG. 9 illustrates the propagation of the spin-orbital wave along the wire of 3 lattice cell width. The state of the leftmost cells, which are input cells, is fixed by the applied magnetic field. Over a scale of a few cells, all the spins are aligned and therefore transmit the logical state of the input cells. This area is followed by alternating areas of spins co- or contra-directional with the input spins. They are ferromagnetic domains and the change of sign is caused by the propagation of the spin wave. Since the wavelength of the wave is defined by the period of the oscillations and the material parameters, the wire still deterministically delivers the direct or inverted input bit sequence depending on the length of the wire. This can be used as length based inverters.

Thus the embodiments of the invention comprise novel ways to encode and process information based on strongly correlated electronic orbital states and electron spin orientation in certain materials such as doped transition metal oxide crystals. Unit cells of these materials are geometrically arranged into functional blocks that can perform a complete set of Boolean logic functions.

In particular:

1. Embodiments of the present invention use materials that have a metal-insulator transition correlated with a magnetic transition between magnetic states (ferromagnetic, anti-ferromagnetic or para-magnetic). Information is encoded into the correlated spin-orbital configuration of unit cells made of such materials.

2. Arranging these unit cells in geometrically contiguous patterns, causing the transition metal atoms to interact through quantum mechanical interactions (e.g., exchange or double exchange interactions) so as to form elementary logic gates (e.g., inverter, and majority gate, etc.). The architectural arrangement of unit cells to perform logic is generically referred to as Quantum Cellular Automata and has been reduced to practice using other physical instantiations (e.g., quantum dot unit cells and micron-scale magnetic elements).

3. Interface with electronic circuits for spin input or spin output: e.g., input of spin states via current loops and read-off of computation results via magnetoresistance values.

Embodiments of the present invention devices and computing architecture for spin-orbital based logic are continuously scaleable to the single crystal lattice limit. Since they use spin-orbital interaction rather than electron current, they can be made denser and less power consuming. Also since the ferromagnetic state is preserved after the power is off, the logic and memory is non-volatile and instantly comes "on" to the state before switching off. That characteristic may apply to potential memory operation with long duration of states.

While certain preferred embodiments of the present invention have been disclosed and described herein for purposes of illustration, it will be understood by those skilled in the art that various changes in form and detail may be made therein without departing from the spirit and scope of the invention.

What is claimed is:

1. A logic device comprising:
    a collection of unit cells with significant quantum exchange interaction between the constituents of the cells, the unit cells being composed of nano-domains of lattice cells within a single crystal comprising the thin film, the logical state of the said device being represented by the spin state or orbital state of said unit cells.

2. The logic device of claim 1 further comprised of a thin film containing the unit cells.

3. The logic device of claim 1 wherein the unit cells are arranged in a pattern corresponding to specific logical operations.

4. The logic device of claim 1 produced by patterning a thin film of a material on a substrate.

5. The logic device of claim 4 wherein the thin film is patterned to define at least one input and at least one output, and to perform at least one logic operation by associated arrangement of the spin states or orbital states of the thin film between the input and the output.

6. The logic device of claim 5 wherein input states of a specified unit cell are defined by an external magnetic field.

7. The logic device of claim 5 wherein the output states are detected by detecting a magnetic field of output unit cells.

8. The logic device of claim 1 wherein the unit cells comprise a transition metal oxide.

9. The logic device of claim 1 wherein at least one of the logic operations has three inputs and one output, and is configured to perform the logic operation of a majority gate.

10. The logic device of claim 9 wherein one of the three inputs is configured to have a fixed state.

11. An integrated circuit comprising:
    a substrate;
    a thin film of material on the substrate comprising a collection of unit cells with significant quantum exchange interaction between the constituents of the cells;
    the thin film being patterned to define at least two inputs and at least one output, and to perform a plurality of logic operations by associated arrangement of the spin states or orbital states between the inputs and the output;
    an input device at each input to define the spin states or orbital states at each input; and,
    an output sensor at each output for sensing the spin states or orbital states of the thin film at the output.

12. The integrated circuit of claim 11 wherein the input device comprises an electromagnetic input device.

13. The integrated circuit of claim 11 wherein the output sensor is a magnetic output sensor.

14. The integrated circuit of claim 11 wherein the thin film is patterned to couple a spin state or orbital state representing the result of one logic operation as at least one input for another logic operation.

15. The integrated circuit of claim 11 wherein the material is a transition metal oxide.

16. The integrated circuit of claim 11 wherein at least one logic operation has three inputs and one output, and the logic operation to be performed is the logic operation of a majority gate.

17. The integrated circuit of claim 11 wherein one of the three inputs is coupled to provide a fixed state.

18. An integrated circuit comprising:
    a substrate;
    a thin film of a transition metal oxide on the substrate comprising a collection of unit cells with significant quantum exchange interaction between the constituents of the cells;
    the thin film being patterned to define at least two inputs and at least one output, and to perform a plurality of logic operations by associated arrangement of the spin states or orbital states between the inputs and the output, and to couple a spin state or orbital state representing the result of one logic operation as at least one input for another logic operation;

an input device at each input to define the spin states or orbital states at each input; and, an output sensor at each output for sensing the spin states or orbital states of the thin film at the output.

19. The integrated circuit of claim 18 wherein the input device comprises an electromagnetic input device.

20. The integrated circuit of claim 18 wherein the output sensor is a magnetic output sensor.

21. The integrated circuit of claim 18 wherein at least one logic operation has three inputs and one output, and the logic operation to be performed is the logic operation of a majority gate.

22. The integrated circuit of claim 21 wherein one of the three inputs is coupled to provide a fixed state.

23. A logic device comprising:

a collection of unit cells with significant quantum exchange interaction between the constituents of the cells, the logical state of the said device being represented by the spin state or orbital state of said unit cells, the unit cells produced by patterning a thin film of a material on a substrate, the thin film being patterned to define at least one input and at least one output, and to perform at least one logic operation by associated arrangement of the spin states or orbital states of the thin film between the input and the output.

24. A logic device comprising:

a collection of unit cells of a transition metal oxide with significant quantum exchange interaction between the constituents of the cells, the logical state of the said device being represented by the spin state or orbital state of said unit cells.

25. A logic device comprising:

a collection of unit cells with significant quantum exchange interaction between the constituents of the cells, the logical state of the said device being represented by the spin state or orbital state of said unit cells at least one of the logic operations having three inputs and one output, and configured to perform the logic operation of a majority gate.

* * * * *

UNITED STATES PATENT AND TRADEMARK OFFICE
CERTIFICATE OF CORRECTION

| | |
|---|---|
| PATENT NO. | : 7,212,026 B2 |
| APPLICATION NO. | : 10/978115 |
| DATED | : May 1, 2007 |
| INVENTOR(S) | : Bourianoff et al. |

It is certified that error appears in the above-identified patent and that said Letters Patent is hereby corrected as shown below:

On Title Page

Item (57), at line 16 of the Abstract, delete "overall." and insert --overall--.

Column 6, at line 56, delete "11" and insert --16--.

Signed and Sealed this

Twenty-ninth Day of April, 2008

JON W. DUDAS
*Director of the United States Patent and Trademark Office*